United States Patent [19]

Brown et al.

[11] Patent Number: 5,672,958
[45] Date of Patent: Sep. 30, 1997

[54] METHOD AND APPARATUS FOR MODIFYING FEEDBACK SENSING FOR A REDUNDANT POWER SUPPLY SYSTEM

[75] Inventors: Alan E. Brown, Georgetown; Nathan Wiscombe, Cedar Park, both of Tex.

[73] Assignee: Dell USA L.P., Austin, Tex.

[21] Appl. No.: 555,689

[22] Filed: Nov. 14, 1995

[51] Int. Cl.⁶ ................................................. G05F 1/40
[52] U.S. Cl. ........................... 323/269; 323/272; 363/69; 307/53
[58] Field of Search .................... 323/269, 272, 323/283; 363/65, 69, 70, 71; 307/53, 64

[56] References Cited

U.S. PATENT DOCUMENTS

| | | | |
|---|---|---|---|
| 3,808,452 | 4/1974 | Hutchinson | 307/64 |
| 4,035,716 | 7/1977 | Hutchinson | 323/20 |
| 4,074,182 | 2/1978 | Weischedel | 323/25 |
| 4,359,679 | 11/1982 | Regan | 323/272 |
| 5,319,536 | 6/1994 | Malik | 363/65 |
| 5,428,523 | 6/1995 | McDonnal | 363/71 |
| 5,428,524 | 6/1995 | Massie | 363/65 |

*Primary Examiner*—Stuart N. Hecker
*Attorney, Agent, or Firm*—Stanford & Bennett

[57] ABSTRACT

A feedback sensing system including a control circuit for detecting power failure of either power supply, and for controlling first and second switch circuits to modify the feedback sensing path of the other supply to the output load. In this manner, when one power supply fails, the feedback sensing path of the other power supply is rerouted to the output node to directly monitor and regulate the voltage across the load. Each switch circuit preferably operates to switch between two nodes along the respective output paths of the power supply, including a first node located before the current control device and a second node located between the current control device and the load. In one embodiment, each switch circuit includes two switches operated in a mutually-exclusive manner. In another embodiment, each switch circuit includes a relatively low value resistive device coupled between the output sense input and the first node, and a switch coupled between the output sense input and the second node for swamping the resistive device when activated or otherwise turned on.

20 Claims, 4 Drawing Sheets

METHOD AND APPARATUS FOR MODIFYING FEEDBACK SENSING FOR A REDUNDANT POWER SUPPLY SYSTEM

FIELD OF THE INVENTION

The present invention relates to redundant power supplies, and more particularly to a method and apparatus for modifying the feedback path in the event of failure of either power supply in a redundant system.

DESCRIPTION OF THE RELATED ART

There is often the need or the desire to use standard components or assemblies in system designs. This is particularly true for the personal computer (PC) industry, where cost and availability are the primary motivating factors for using standard parts and components. This is also true for high-end computer systems, such as servers or the like, where cost and availability are very important design considerations. For example, it is desired to use standard power supplies when configured in redundant systems, where the power supplies have their outputs actively paralleled to power the PC or server. The use of specialized power supplies for achieving a redundant power supply system is expensive and thus not favored.

The output voltage of two standard power supplies are rarely regulated at the same voltage level, so that their outputs cannot be connected directly together. If their outputs were connected directly together, the supply regulating its output at a higher voltage level would attempt to provide most, if not all, of the load current, thereby defeating the intent of current sharing. Therefore, in order to achieve a redundant system, two power supplies may have their outputs paralleled using current control devices coupled in series with the output path of each power supply, where the current devices are used to control the current provided by each supply to the system load. A controller monitors the output of each power supply and the voltage at the load, and controls the current devices accordingly. Generally, the device in the output path of the lower voltage supply turns the current device fully on, while operating the other current device in an active region to equalize the voltages. Thus, the current devices are controlled so that both power supplies provide substantially equal voltage and also provide substantially equal current to the load.

Since it is desired to regulate the voltage supply at the load as accurately as possible, the voltage drop across the series current devices should be as small as possible. Usually, several parallel-connected metal-oxide semiconductor field-effect transistors (MOSFETs) are used to increase current capacity and reduce voltage drop to a low level, such as several millivolts (mV) or thereabouts. Each power supply must regulate its own output by remotely sensing the voltage level at a node at or near the input of its respective current device, since the voltage provided to the load is also dependent on the other power supply.

The configuration described above is sufficient so long as both power supplies and the controller for the control elements are functioning properly. However, failure of any one of these components causes an undesirable situation. For example, if one power supply fails, then the other supply must provide all of the current to the load. The current control device must then handle about twice its normal operating current, and thus inserts roughly twice its normal voltage drop. This results in a sudden voltage drop at the load, which is undesirable for several reasons. One solution to maintain the voltage level is to double the number of high-current, parallel-coupled current devices. This is true for both control devices since either power supply could fail. Since the current control devices are often implemented using MOSFETs, the resulting solution is relatively inefficient and expensive.

It is desired to detect the failure of a power supply in a redundant system and to regulate the output at the load at the desired level without having to increase the number of series control elements for controlling each power supply output.

SUMMARY OF THE INVENTION

A feedback sensing system according to the present invention for controlling power provided to a load of a redundant power supply system includes a control circuit for detecting power failure of either power supply, and for controlling first and second switch circuits to reroute the feedback sensing path of the other supply to the output load. In this manner, when one power supply fails, the feedback sensing path of the other power supply is rerouted to the output node to directly monitor and regulate the voltage across the load. Thus, additional current control elements are not required to reduce the voltage drop in the output path of the remaining power supply, which might otherwise prevent proper control and output sensing at the load.

In the preferred embodiment, the control logic monitors the voltage at the load and at the outputs of both power supplies before the current control devices, and controls the current devices to achieve the desired current sharing between the power supplies. The control logic may be implemented using a microprocessor or the like for performing all control functions. Alternatively, the control logic may be implemented using discrete logic or through software, or any other method known to those skilled in the art.

Each power supply includes a power output and an output sense input. Each of the switch circuits preferably operate as a single-pole, double-throw (SPDT) switch, having a common node for coupling to the output sense input of a respective power supply. Each switch circuit switches between two nodes along the respective output path of the power supply, including a first node located between the power supply output and the current control device and a second node located between the current control device and the load. The first node is preferably located close to the current control device and the second node is preferably located at the load. The control circuit preferably asserts sense signals to control each of the switch circuits. During normal operation, each switch circuit selects the first node located before the current control device to enable each power supply to regulated its own output, while the control circuit controls the current devices to achieve the desired current sharing. If a power supply fails, the control circuit switches the switch circuit coupled to the remaining and operating power supply to couple its output sense input to the node located at or near the load. This prevents voltage drop in the output path since the operating power supply directly regulates the voltage at or near the load.

In one embodiment according to the present invention, each switch circuit includes two switches operated in a mutually-exclusive manner to switch between the two remote sensing nodes. The switches are preferably implemented with unidirectional analog switches, such as MOSFETs or the like.

In another embodiment according to the present invention, each switch circuit includes a relatively low value resistive device coupled between the output sense input and the first node for sensing the voltage before the current control device during normal operation. Also, a switch is coupled between the output sense input and the second load node, which swamps the resistive device when activated or otherwise turned on. In particular, the switch has a high resistance for effectively open circuiting the feedback sense node located at the load when the switch is turned off, but has a substantially lower resistance than the resistive element when turned on. This embodiment provides a more cost-effective solution, since a relatively inexpensive resistor may be used as the resistive element, rather than a MOSFET. Two separate embodiments are shown implemented with n-channel or p-channel MOSFETs as the switch devices.

It is now appreciated that a feedback sensing system according to the present invention alleviates the need for an excessive number of parallel-coupled current control devices, such as expensive MOSFETs, for reducing voltage drop in each of the output paths in a redundant power supply system. The present invention therefore provides an efficient and relatively inexpensive design.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
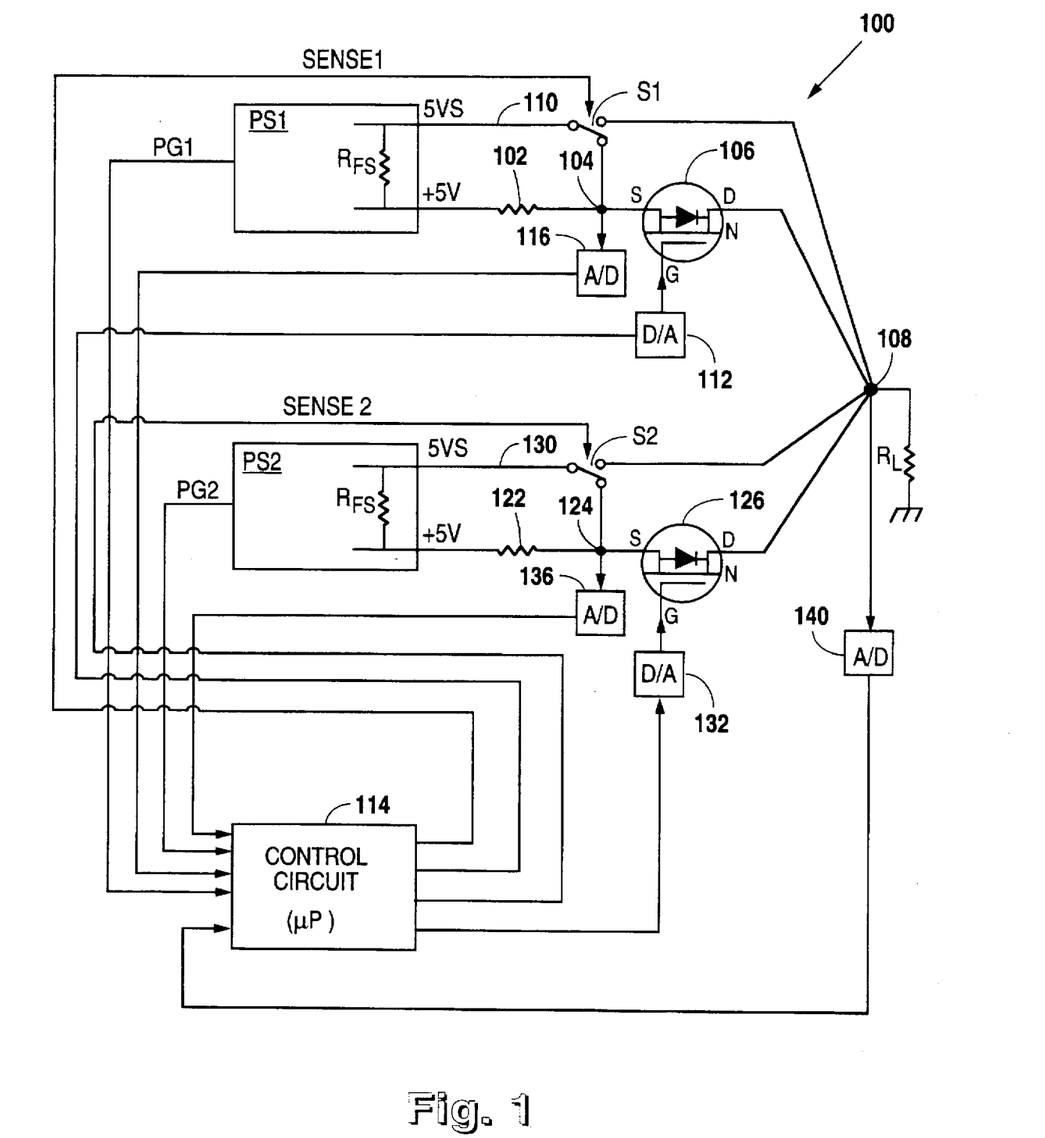
FIG. 1 is a schematic and block diagram illustrating a redundant power supply according to the present invention.

Referring now to FIG. 1, a block diagram is shown of a redundant power supply system 100 implemented according to the present invention. The power supply system 100 is preferably used for providing power to a computer system, such as a server, personal computer (PC), or the like, but may also be used for providing power to any electronic device. The computer or electronic device is generally represented as a load resistor (or impedance) $R_L$, which receives power from two similar power supplies PS1 and PS2 coupled in a parallel configuration. In general, the power supplies PS1 and PS2 share the load current provided to the load $R_L$, so that each provides approximately half the load current. If one of the power supplies PS1 or PS2 fails in the redundant power supply system 100, the other power supply responds by doubling its output current capacity to maintain power and load current to the load $R_L$. The failed power supply is then either serviced or replaced. The use of two redundant and relatively similar power supplies PS1 and PS2 ensures a substantially lower likelihood of unexpected power failure.

Each of the power supplies PS1 and PS2 provide a plurality of power signals, such as +/−5V, +/−12V, +/−3.3V, etc., although only the +5V output power signal is shown for purposes of clarity. Each of the power supplies PS1 and PS2 also includes an output sense input for the +5V output, referred to as an input 5VS, for sensing and regulating the output voltage for control and feedback purposes. Other outputs of PS1 and PS2 might also include corresponding sense inputs, although the +5V output typically provides a substantial portion of the total current and is thus the most important from a power standpoint. Each power supply PS1 and PS2 further includes an internal fail-safe resistive device or resistor $R_{FS}$, which provides a fail-safe feedback path in the event that the feedback path for the 5VS input is somehow disconnected or otherwise open-circuited. The resistance of the resistor $R_{FS}$ is substantially larger than the normal operating feedback path for the 5VS input, so that the $R_{FS}$ resistor is swamped out during normal operation, meaning that the $R_{FS}$ resistor has little effect on feedback operation. The resistance of the $R_{FS}$ resistor is preferably approximately $51\Omega$.

Both of the power supplies PS1 and PS2 assert a +5V regulated output signal for providing load current to the load $R_L$. The actual regulated voltage usually varies from one power supply to the next by several millivolts (mV) or more, so that the +5V outputs of both of the power supplies PS1 and PS2 are not directly connected together. Otherwise, one power supply providing a slightly greater voltage level would attempt to provide most or all of the load current to the load $R_L$. It is desired that the power supplies PS1 and PS2 provide substantially equal amounts of current for current sharing purposes. To achieve this purpose, two current control devices 106 and 126 are inserted in series in the output current paths 102, 122 of the power supplies PS1 and PS2, respectively, for controlling the current to the load $R_L$. The current control devices 106 and 126 may be any suitable controlled current device, such as analog switches, bipolar transistors, etc., but are preferably n-channel enhancement metal-oxide-semiconductor field-effect transistors (MOSFETs).

The output paths 102, 122 are illustrated as resistances, which are not physical resistors but generally represent the resistance of conductors, connectors, contact junctions, etc., typically encountered in a high current power path, and are each generally on the order of several $m\Omega$. Since a high amount of current is flowing through the output paths 102 and 122 during normal operation, such as between 20–40 amperes or more, even small resistances insert substantial voltage drops in the output paths. Such resistances must be taken into consideration or otherwise bypassed when regulating the output voltages of PS1 and PS2. Nodes 104 and 124 represent points along the output paths 102 and 122, respectively, located at or very near the "inputs" of the current control devices 106 and 126, respectively. These nodes are used as feedback sense nodes by PS1 and PS2 during normal operation, as described more fully below.

The +5V output of PS1 is provided on the output path 102 to the source of a MOSFET implementing the current control device 106, having its drain connected through a suitable conductor to a common output junction or node 108 located near or adjacent to one end of the load $R_L$. The other end of the load $R_L$ is connected to chassis ground. The gate of the MOSFET 106 is coupled to the output of a digital-to-analog (D/A) converter 112, which receives a digital control signal input from a control circuit 114. In a similar manner, the +5V output of PS2 is provided on an output path 122 to the source of another n-channel MOSFET implementing the current control device 126, having its drain connected to the output node 108. The control circuit 114 provides a digital control signal to a D/A converter 132, having its output connected to control the gate of the MOSFET 126. Thus the control circuit 114 controls the amount of current provided to the load $R_L$ from both PS1 and PS2.

The output node 108 is coupled to the input of an analog-to-digital (A/D) converter 140, having its output coupled to an input of the control circuit 114. An A/D converter 116 has its input coupled at the node 104 located near or adjacent to the source of the MOSFET 106, and has an output coupled to an input of the control circuit 114. Likewise, another A/D converter 136 has its input coupled at the node 124 located near or adjacent to the source of the MOSFET 126, and has an output coupled to another input of the control circuit 114. In this manner, the control circuit 114 monitors the voltage level of the output node 108, and also monitors the voltage level of outputs of PS1 and PS2 at the nodes 104, 124, respectively. The control circuit 114 correspondingly controls the MOSFETs 106, 126 through the D/A converters 112 and 132, respectively, to achieve current share between PS1 and PS2.

For example, if PS1 normally regulates its output at 5.2V, while PS2 normally regulates its output at 5.1V, then the control circuit 114 asserts a higher or the highest digital value to the D/A converter 132 for turning the MOSFET 126 fully on. However, the control circuit 114 does not drive the MOSFET 106 fully on, but instead asserts a lower digital value to the D/A converter 112 to operate the MOSFET 106 in the active region. This effectively reduces the voltage of the output of PS1 by increasing the voltage drop across the MOSFET 106, which is approximately 100 mV in this example. In this manner, the voltage on the output side of the MOSFETs 106 and 126 is approximately 5.1V to achieve appropriate current sharing purposes, where PS1 and PS2 provide substantially equal load current. The actual voltage at the output node 108 depends upon any further losses along the respective output paths.

The A/D converters 116 and 136 are optional and may be eliminated depending upon the sophistication of the control circuit 114. The control circuit 114 preferably includes a microprocessor, microcontroller, or similar control device, which may be programmed to accurately monitor and analyze the voltage of the output node 108 and control the MOSFETs 106 and 126 in the desired manner. Although this would require a smart program for the control circuit 114, this would eliminate the A/D converters 116, 136.

It is noted that both of the power supplies PS1 and PS2 are each providing a significant amount of current to the load $R_L$, such as, for example, between 20 and 40 amperes each, so that the MOSFETs 106 and 126 should have sufficient current capacity. Preferably, the drain to source resistance of a MOSFET while activated or turned on, referred to as $RDS_{ON}$, should be as low as possible in order to maintain the voltage at the output node 108 as close to 5V as possible. Since PS1 and PS2 are not sensing, and thus not directly regulating, the voltage at the output node 108, an increased voltage drop across the MOSFETs 106 and 126 is not corrected by PS1 or PS2. In this manner, a plurality of MOSFETs are typically coupled in parallel to increase the current capacity and to reduce the effective drain to source resistance during operation. Several parallel-coupled devices decrease voltage drop and increase efficiency of the redundant power supply system 100. However, as described further below, such MOSFETs are also expensive and it is desired to use as few as necessary.

The power supplies PS1 and PS2 are often separated or remotely located relative to a paralleling board or the like incorporating the MOSFETs 106 and 126, as well as the control circuit 114. To reduce the effects of the resistance of the output paths 102 and 122 between the +5V outputs of PS1 and PS2 and the MOSFETs 106 and 126, respectively, it is desired to remotely sense the voltage at the sources of each of the MOSFETs 106, 126 at the nodes 104, 124, respectively. A controllable single-pole, double throw (SPDT) switch S1 has one switchable pole connected to the node 104, another switchable pole coupled to the output node 108 and a common pole connected through a conductor 110, to the 5VS input of PS1. The switch S1 has a control input receiving a signal SENSE1 from the control circuit 114 for switching between the switchable poles to connect the 5VS input of PS1 to either the node 104, or to the output node 108, based upon the SENSE1 signal. In particular, if the control circuit 114 asserts the SENSE1 signal low, then the node 104 is selected, and if the SENSE1 signal is asserted high, then the output node 108 is selected.

In a similar manner, another SPDT controllable switch S2 has one switchable pole connected to the node 124 and its other switchable pole connected to the output node 108. A common pole is connected through a conductor, represented as a conductor 130, to the 5VS input of PS2. The switch S2 has a control input receiving a signal SENSE2 from the control circuit 114 for switching between the switchable poles to connect the 5VS input of PS2 to either the node 104, or to the output node 108, based upon the SENSE2 signal. In particular, if the control circuit 114 deasserts the SENSE2 signal low, then the node 124 is selected, and if the SENSE2 signal is asserted high, then the output node 108 is selected.

During normal operation, the SENSE1 and SENSE2 signals are deasserted, so that the switches S1 and S2 select the nodes 104 and 124. Since the effective resistances between the 5VS input and +5V signal across the conductors 110, 130 is substantially less than the resistors $R_{FS}$, the resistors $R_{FS}$ are swamped and thereby do not affect circuit operation. Both of the power supplies PS1 and PS2 therefore regulate the output voltages at the nodes 104, 124 for current sharing purposes. The voltage drop across each of the MOSFETs 106 and 126 is relatively small, so that the voltage at the output node 108 is regulated at approximately the desired output voltage level required for the load $R_L$.

Traditional designs did not use the switches S1 or S2 but only sensed the voltage at the nodes 104, 124. This is sufficient for indirectly regulating the voltage at the output node 108 and also for providing appropriate current sharing between the power supplies PS1 and PS2 to the output load $R_L$ during normal operation. However, if either power supply should fail, then the other power supply must supply full load current to the output load $R_L$. Since the current through the current control device, such as either the MOSFET 106 or the MOSFET 126, is effectively doubled, its drain to source voltage drop is doubled, which is undesirable since the voltage at the output node 108 is correspondingly reduced by an undesirable amount. In traditional designs, the number of MOSFETs used for implementing the MOSFETs 106 and 126 was doubled in order to ensure a minimum voltage drop across the paralleled MOSFETs in the event of a power failure of one of the power supplies PS1 and PS2. Saturating the existing MOSFETs is generally not a sufficient solution. Thus, traditional designs required twice as many MOSFETs to implement the current control devices for both output paths, which ended in a relatively expensive and inefficient design. It is therefore not desired to double the number of MOSFETs to implement the current control devices.

For operation according to the present invention, two power status signals, PG1 and PG2, are provided from the respective power supplies PS1 and PS2 to the control circuit 114. The PC1 and PC2 signals could be the standard "power good" signals often used in power supplies, but this is not necessarily the case. It is preferred that the PC1 and PG2 signals are indicative of a combination of status signals indicative of the power status of PS1 and PS2, respectively. The control circuit 114 operates by monitoring the PG1 and PG2 signals and controlling the switches S1 and S2 to modify or otherwise redirect the feedback paths to the 5VS inputs of either PS1 or PS2 in the event of a power failure of either PS1 or PS2. In normal operation, both of the power status signals PC1 and PG2 are asserted, so that the switches S1 and S2 select the nodes 104 and 124, respectively. If the power supply PS1 fails, then the PC1 signal is deasserted as detected by the control circuit 114. The control circuit 114 correspondingly asserts the SENSE2 signal for switching the switch S2 to select the output node 108. In this manner, the power supply PS2 remotely senses the voltage at the output node 108 since only the power supply PS2 is providing power to the load $R_L$. Thus, the power supply PS2 is better able to regulate the voltage at the output node 108 at the desired voltage level.

In particular, the power supply PS2 asserts a higher voltage level on the +5V signal to account for voltage drops across the conductor 122 and the MOSFET 126 to appropriately regulate the voltage at the output node 108. The same is true should the power supply PS2 fall while the power supply PS1 is operating. In particular, if the PG2 signal is deasserted, then the control circuit 114 asserts the SENSE1 signal to the switch S1 for selecting the output node 108, rather than the node 104. Thus, the power supply PS1 regulates the voltage at the output node 108 at the desired level.

Since a power failure is usually a temporary situation, any power losses associated with higher voltage drops across the conductors 102, 122 and the MOSFETs 106, 126 are tolerated. Eventually, the failed power supply is serviced or otherwise replaced and current sharing is re-enabled as desired.

It is noted that the switches S1 and S2 of the power supply system 100 are shown to illustrate functional operation. Mechanical SPDT switches, such as relays and the like, could be used but typically have relatively slow switching times, are expensive and relatively unreliable, and thus are generally unsuitable for feedback control purposes. In this manner, the SPDT switches S1 and S2 are typically implemented using bipolar transistors, analog switches, analog multiplexers, MOSFETs, and the like, which are less expensive, substantially more reliable and have substantially faster switching times. Low on-resistance is desired to swamp the fail-safe resistances $R_{FS}$ within each of the power supplies PS1 and PS2 for appropriate feedback and control purposes.

Figure 2:
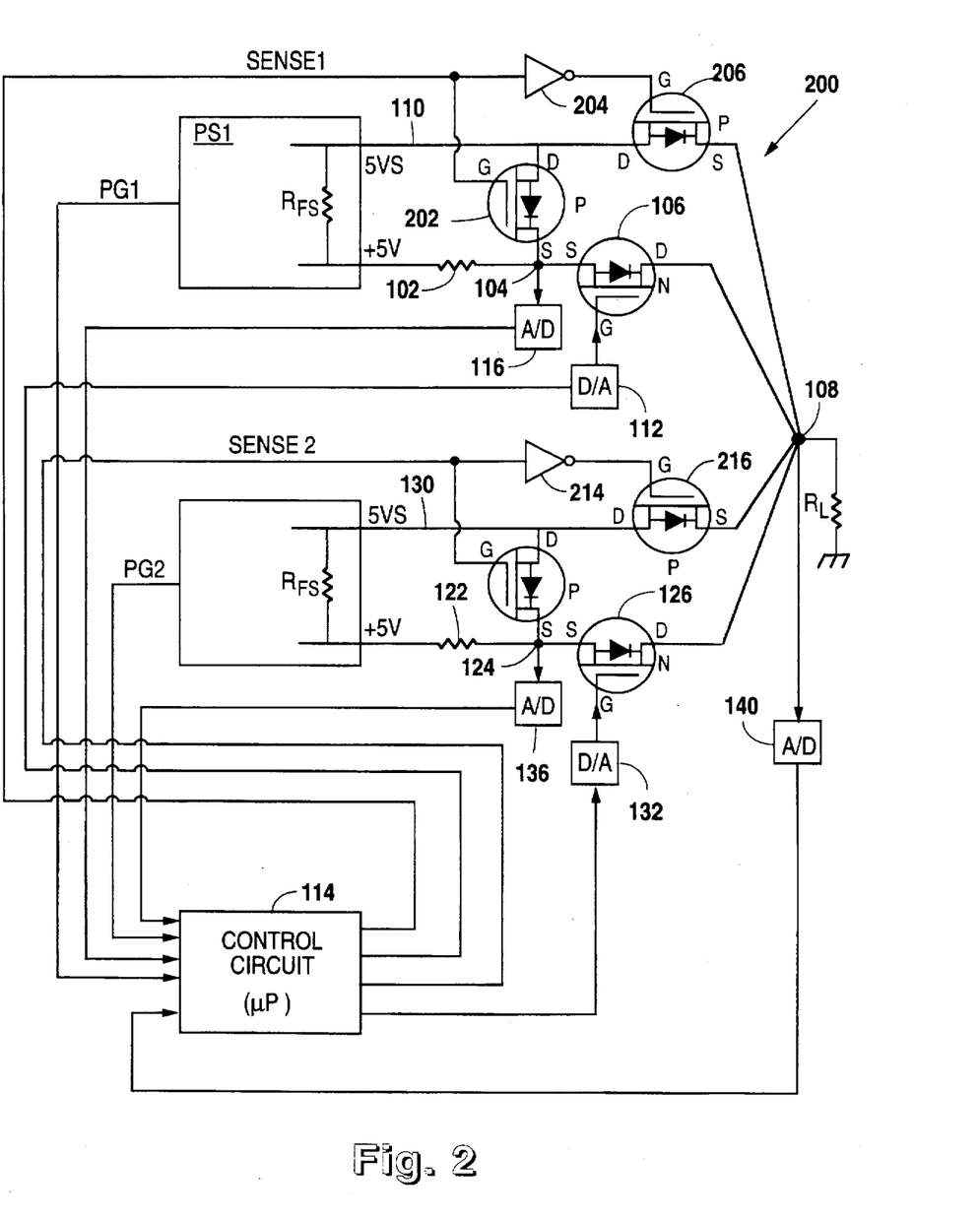
FIG. 2 is a schematic and block diagram illustrating a redundant power supply system according to an alternative embodiment of the present invention.

Referring now to FIG. 2, a schematic and block diagram is shown of a redundant power supply system 200 implemented according to an alternative embodiment of the present invention. The power supply system 200 is similar and includes similar components to the power supply system 100, where similar components assume identical reference numbers. The switches S1 and S2, however, are replaced by analog switching devices. The operation of the remaining circuitry is effectively the same.

In FIG. 2, a p-channel MOSFET 202 has its source connected to the node 104, its drain coupled to the conductor 110 and its gate receiving the SENSE1 signal. Another p-channel MOSFET 206 has its drain coupled to the conductor 110 for providing the 5VS input, its source coupled to the output node 108 and its gate coupled to the output of an inverter 204. The input of the inverter 204 receives the SENSE1 signal. In a similar manner, the SENSE2 signal is provided to the gate of a p-channel MOSFET 212 and to the input of an inverter 214. The source of the MOSFET 212 is coupled to the node 124 and the drain of the MOSFET 212 is coupled to the conductor 130 and to the drain of another p-channel MOSFET 216. The source of the MOSFET 216 is coupled to the output node 108, and its gate is coupled to the output of the inverter 214.

Operation of the redundant power supply system 200 is similar to the operation of the redundant power supply system 100. During normal operation, both the SENSE1 and SENSE2 signals are deasserted low, which activates the MOSFETs 202 and 212 for enabling the power supplies PS1 and PS2 to monitor and regulate the voltages at the nodes 104, 124, respectively. The gates of the MOSFETs 206, 216 are asserted high through the inverters 204, 214, respectively, so that the MOSFETs 206, 216 are turned off. Thus, the MOSFETs 202 and 206 as well as the MOSFETs 212 and 216 are operated in a mutually-exclusive manner, so that when one is on, the other is off, and vice-versa. If PS1 fails, the PG1 signal is deasserted low, and the control circuit 114 correspondingly asserts the SENSE2 signal to turn off the MOSFET 212 and to turn on the MOSFET 216. The power supply PS2 therefore senses the voltage at the output node 108 for more effectively monitoring the voltage across the load $R_L$. Likewise, if PS2 fails, the PG2 signal is deasserted and the control circuit 114 correspondingly asserts the SENSE1 signal. The MOSFET 202 is turned off and the MOSFET 206 is turned on, so that PS1 regulates the voltage at the output node 108. Again, the $RDS_{ON}$ resistance of each of the MOSFETs 202, 206, 212 and 216 is significantly lower than the resistors $R_{FS}$ of both PS1 and PS2 for swamping the resistors $R_{FS}$.

The switching devices are preferably unidirectional analog switches or the like. The MOSFETs 202 and 206 enable current flow from either the nodes 104 or 108 to the 5VS input of PS1 when turned on, but do not allow current flow in the other direction when turned off. In particular, the inherent diodes within the MOSFETs 202 and 206 do not allow current flow into the 5VS input when turned off. The same is true for the MOSFETs 212 and 216, which enable current flow into the 5VS input of PS2 when turned on, but otherwise disable current flow into the 5VS input when turned off.

Figure 3:
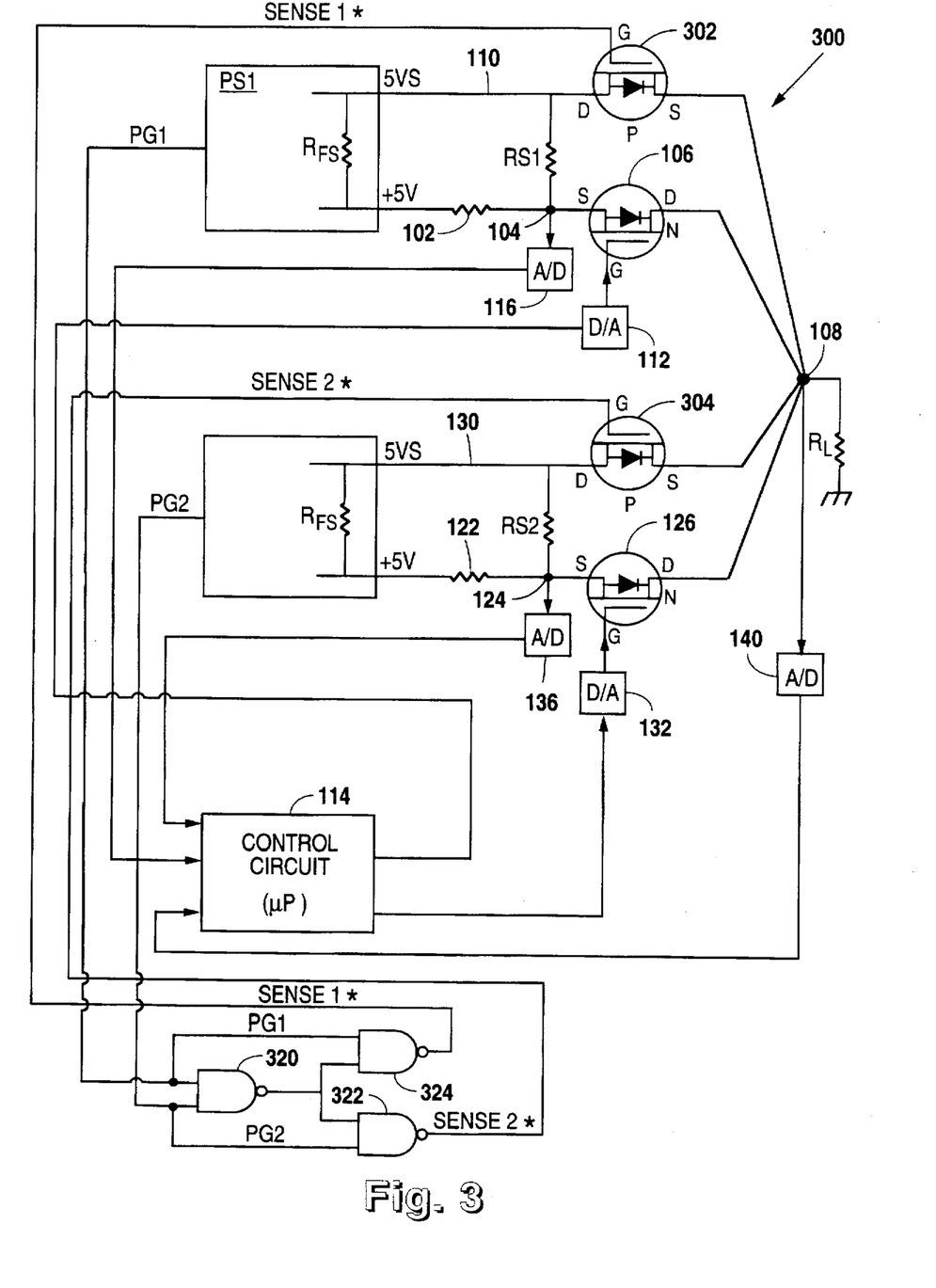
FIG. 3 is a schematic and block diagram illustrating a redundant power supply system according to another alternative embodiment of the present invention.

Referring now to FIG. 3, a schematic and block diagram is shown illustrating a redundant power supply system 300 according to another alternative embodiment of the present invention. Again, similar components assume identical reference numbers as shown in FIGS. 1 and 2. In this case, however, a sense resistor RS1 is coupled between the conductor 110 and the node 104. Another sense resistor RS2 is connected between the conductor 130 and the node 124. The sense resistors RS1 and RS2 are preferably relatively low value resistors, such as approximately 2.2Ω, which is substantially lower than the fail-safe resistors $R_{FS}$ for effectively swamping the $R_{FS}$ resistors during normal operation.

A control circuit 310 is similar to the control circuit 114, except that it does not assert the SENSE1 and SENSE2 signals, but rather simply receives the outputs of the A/D converters 140, 116 and 136, and controls the D/A converters 112 and 132. The power status signals PG1 and PG2 are provided to the inputs of a two-input NAND gate 320, having its output connected to one input each of two more two-input NAND gates 322 and 324. The PG2 signal is provided to the other input of the NAND gate 322 and the PC1 signal is provided to the other input of the NAND gate 324. The NAND gate 322 asserts a signal SENSE2*, and the NAND gate 324 asserts a sense signal SENSE1*. A signal named having an asterisk (*) at the end denotes negative logic, where the signal is considered asserted when low and deasserted when high. The SENSE1* signal is provided to the gate of a p-channel MOSFET 302, having its drain connected to the conductor 110 and its source connected to the output node 108. In a similar manner, the SENSE2* signal is provided to the gate of another p-channel MOSFET 304, having its drain coupled to the conductor 130 and its source coupled to the output node 108.

During normal operation, the SENSE1* and SENSE2* signals are deasserted high, thereby turning off the MOSFETs 302 and 304. The inherent diodes within the MOSFETs 302 and 304 disable current flow from the output node 108 to the 5VS inputs of PS1 and PS2. The resistors RS1 and RS2 effectively swamp the fail-safe resistors $R_{FS}$ within PS1 and PS2 for monitoring the voltage at the nodes 104 and 124. If a power supply fails, such as the power supply PS1, the PG1 signal is deasserted low, so that the NAND gate 322 asserts the SENSE2* signal low. This turns on the MOSFET 304, which provides a relatively low resistance, such as on the order of several mΩ, between the 5VS input and the output node 108. Since the $RDS_{ON}$ of the MOSFET 126 is also relatively low, the combined $RDS_{ON}$ resistance of the MOSFETs 304 and 126 is substantially lower than the resistance of RS2, thereby swamping the RS2 resistor. In this manner, when the MOSFET 304 is turned on, the resistor RS2 is effectively swamped or bypassed by the MOSFET 304. This enables PS2 to regulate the voltage at the output node 108 more directly, thereby maintaining the desired output voltage.

Likewise, if the power supply PS2 fails, and the PG2 signal is deasserted, so that the NAND gate 324 asserts the SENSE1* signal low, turning on the MOSFET 302. The MOSFET 302 thereby swamps the resistor RS1, so that the power supply PS1 regulates the output voltage at the output node 108.

It is appreciated that the operation of the redundant power supply system 300 is similar to the power supply system 200, except that sense resistors RS1 and RS2 are used rather than the MOSFETs 202 and 212. Furthermore, discrete logic for achieving mutually exclusive operation, such as the inverters 204 and 214, is not necessary. In this manner, the redundant power supply system 300 is a reliable and cost effective solution for regulating the output voltage across the load $R_L$ in the event of power failure of either power supply PS1 or PS2.

Figure 4:
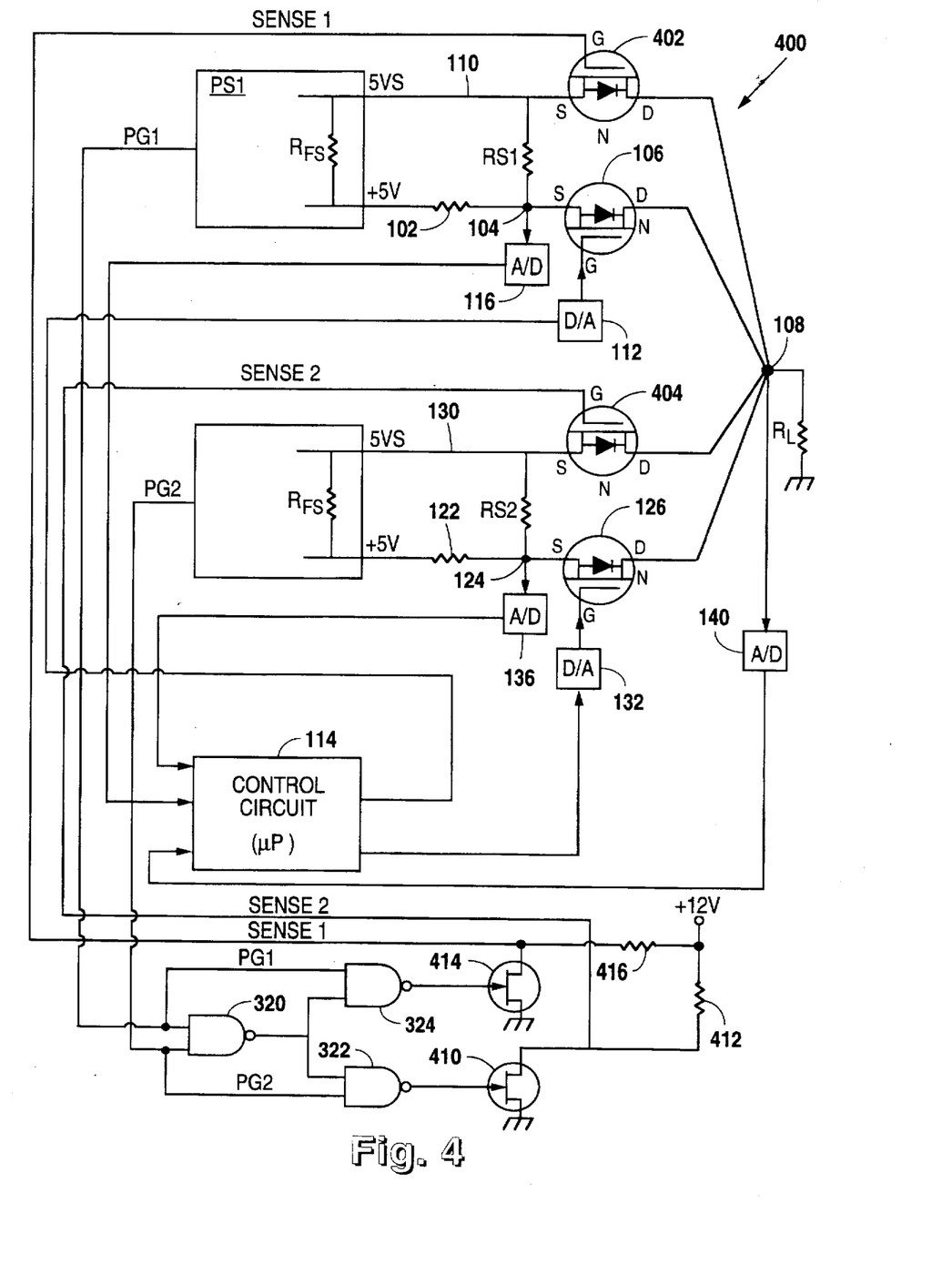
FIG. 4 is a schematic and block diagram of a redundant power supply system according to yet another alternative embodiment of the present invention.

Referring now to FIG. 4, a schematic and block diagram is shown of a redundant power supply system 400 according to yet another alternative embodiment of the present invention. This embodiment is similar to the redundant power supply system 300, where similar components again assume identical reference numbers. In this case, however, the p-channel MOSFETs 302 and 304 are replaced with n-channel MOSFETs 402 and 404. Thus, the sources of the MOSFETs 402, 404 are coupled to the conductors 110, 130, respectively, and the drains of the MOSFETs 402, 404 are coupled to the output node 108. The gate of the MOSFET 402 receives a signal SENSE1 and the gate of the MOSFET 404 receives a sense signal SENSE2. Again, the MOSFETs 402 and 404 serve as unidirectional analog switches, disabling current flow from the output node 108 to the respective 5VS inputs when turned off. Essentially, the n-channel MOSFETs 402, 404 replace the p-channel MOSFETs 302, 304, respectively. The availability of the +12V signal is a consideration for using this particular embodiment.

The output of the NAND gate 322 is provided to the gate of an n-channel FET 410, having its source connected to ground and its drain coupled to one end of a pull-up resistor 412 for providing the SENSE2 signal. The other end of resistor 412 is connected to a +12V signal. The output of the NAND gate 324 is connected to the gate of a FET 414, having its source connected to ground and its drain coupled to one end of a pull-up resistor 416 for providing the SENSE1 signal. The other end of the resistor 416 is coupled to the +12V signal.

Operation of the redundant power supply system 400 is similar to the power supply system 300, except that the sense signals SENSE1 and SENSE2 are asserted low for turning off the MOSFETs 402, 404 during normal operation. The sense resistors RS1 and RS2 therefore operate to enable the power supplies PS1 and PS2 to monitor the nodes 104 and 124, respectively. During normal operation, both of the NAND gates 322 and 324 assert their outputs high, thereby turning on the FETs 410, 414, so that the SENSE1 and SENSE2 signals are normally asserted low. If the power supply PS2 falls, the PC1 signal is deasserted low, so that the NAND gate 322 deasserts its output low, turning off the FET 410. The SENSE2 signal is therefore pulled high to turn on the MOSFET 404. The $RDS_{ON}$ of the MOSFET 404 swamps the sense resistor RS1, so that the power supply PS2 regulates the voltage of the output node 108 in a similar manner as described previously. Also, if the power supply PS2 fails, the PG2 signal is deasserted low, so that the NAND gate 324 deasserts its output low, turning off the FET 414. This causes the SENSE1 signal to be pulled high, thereby turning on the MOSFET 402. Again, the $RDS_{ON}$ of the MOSFET 402 is substantially smaller than the resistance of the sense resistor RS1, so that the MOSFET 402 swamps the resistor RS1. In this manner, power supply PS1 regulates the voltage at the output node 108 in the event of failure of the power supply PS2.

It is now appreciated that a remote sensing system for controlling power provided to a load of a power supply system according to the present invention enables proper control for current sharing between redundant power supplies during normal operation, and redirects the feedback sense for regulation of the output in the event one of the power supplies falls. In particular, the feedback path of the remaining and operating power supply is redirected to remotely sense the output node across the load, thereby preventing substantial voltage drop when the other supply falls. This eliminates the need for the typical solution of doubling the number of parallel-coupled current control devices to reduce the voltage drop in the operating output path.

Although a system and method according to the present invention has been described in connection with specific embodiments, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A feedback sensing system for controlling power provided to a load of a power supply system, the power supply system including first and second power supplies, each having at least one power output and an output sense input for sensing a node for feedback control, the power supply system further including first and second current control devices coupled in series along first and second output paths, respectively, between the respective outputs of the first and second power supplies and the load, the feedback sensing system comprising:

a first switch circuit for coupling to the output sense input of the first power supply for selecting between first and second nodes along the first output path, wherein said first node is located between the output of the first power supply and the first current control device, and the second node is located between the first current control device and the load;

a second switch circuit for coupling to the output sense input of the second power supply for selecting between first and second nodes along the second output path, wherein said first node is located between the output of the second power supply and the second current control device, and said second node is located between the second current control device and the load; and a control circuit coupled to control said first and second switch circuits to select said first nodes of the first and second output paths during normal operation, said control circuit for detecting failure of the first and second power supplies, wherein if the first power supply fails, said control circuit switches said second switch circuit to select said second node of the second output path, and if said second power supply fails, said control circuit switches said first switch circuit to select said second node of the first output path.

2. The feedback sensing system of claim 1, wherein said first and second switch circuits operate as controlled single-pole, double-throw switches, each having a common pole for coupling to the output sense input of a respective one of the first and second power supplies, and further having first and second switched poles coupled to said first and second nodes, respectively, of a respective one of the first and second output paths.

3. The feedback sensing system of claim 1, wherein said first and second switch circuits each comprise:

a first switch for coupling between a respective output sense input and a first node of a respective output path; and a second switch for coupling between said respective output sense input and the load;

wherein said first and second switches are turned on and off in a mutually-exclusive manner.

4. The feedback sensing system of claim 3, wherein said first and second switches comprise unidirectional analog switches.

5. The feedback sensing system of claim 4, wherein said analog switches are MOSFETs.

6. The feedback sensing system of claim 1, wherein said first and second switch circuits each comprise:

a resistive device for coupling between a respective output sense input and a first node of a respective output path; and a switch having a current path for coupling between said respective output sense input and the load.

7. The feedback sensing system of claim 6, wherein said resistive element comprises a sense resistor.

8. The feedback sensing system of claim 6, wherein said switch has a lower resistance than said resistive device when said switch is turned on, and wherein said switch has a higher resistance than said resistive device when said switch is turned off.

9. The feedback sensing system of claim 8, wherein said switch comprises a unidirectional analog switch for swamping said resistive device when activated.

10. The feedback sensing system of claim 9, wherein said switch is a MOSFET.

11. The feedback sensing system of claim 1, wherein said control circuit comprises a microprocessor.

12. The feedback sensing system of claim 1, wherein said control circuit receives power status signals from the first and second power supplies, wherein if a power status signal indicates power loss of one of the first and second power supplies, said control circuit asserts a sense signal to a corresponding one of said first and second switches coupled the other power supply.

13. The feedback sensing system of claim 1, wherein the first and second power supplies provide first and second power status signals, respectively, and wherein said control circuit includes:

logic for receiving the first and second power status signals and for asserting first and second sense signals to switch said first and second switch circuits, respectively; and wherein if the first power status signal indicates failure of the first power supply, said control circuit asserts said second sense signal to switch said second switch circuit, and if said second power status signal indicates failure of said second power supply, said control circuit asserts said first sense signal to switch said first switch circuit.

14. The feedback sensing system of claim 13, wherein said logic comprises:

a first gate having an output and inputs for receiving the first and second power status signals;

a second gate having a first input for receiving the first power status signal, a second input coupled to said output of said first gate, and an output for providing said first sense signal; and a third gate having a first input for receiving the second power status signal, a second input coupled to said output of said first gate, and an output for providing said second sense signal.

15. The feedback sensing system of claim 1, wherein said first node of both of the first and second output paths is located near a respective one of the first and second current control devices, and wherein said second node of both of the first and second output paths is located near the load.

16. A redundant power supply system for providing power to a load, comprising:

a first power supply having a first power output and an output sense input;

a first current device having a current path coupled in series between said first power output and the load for controlling current to the load from said first power supply;

a first switch circuit for coupling said output sense input of said first power supply to either a first node located between said output of said first power supply and said first current device, or to a second node located between said first current device and the load;

a second power supply having a second power output and an output sense input;

a second current device having a current path coupled in series between said second power output and the load for controlling current to the load from said first power supply;

a second switch circuit for coupling said output sense input of said second power supply to either a third node located between said output of said second power supply and said second current device, or to a fourth node located between said second current device and the load; and a control circuit coupled to said first and second power supplies and said first and second switch circuits, wherein if said first power supply fails, said control circuit switches said second switch circuit to said fourth node from said third node, and wherein if said second power supply fails, said control circuit switches said first switch circuit to said second node from said first node.

17. The redundant power supply system of claim 16, wherein said control circuit includes:

- a first logic gate having an output and having inputs for receiving first and second power status signals from said first and second power supplies, respectively;
- a second logic gate having a first input receiving said first power status signal and a second input coupled to said output of said first logic gate, said second logic gate having an output coupled to control said first switch circuit; and
- a third logic gate having a first input receiving said second power status signal and a second input coupled to said output of said first logic gate, said third logic gate having an output coupled to control said second switch circuit.

18. The redundant power supply system of claim 16, wherein said first and second switch circuits each comprise:

- a resistive element for coupling between a respective output sense input and a respective one of said first and third nodes; and
- a switch for coupling between said respective output sense input and the load for swamping said resistive element when said switch is turned on.

19. The redundant power supply system of claim 18, wherein said switch has a higher resistance when turned off and a lower resistance when turned on than said resistive element.

20. The redundant power supply system of claim 19, wherein said switch comprises a unidirectional analog switch.

* * * * *